(12) United States Patent
Chiu

(10) Patent No.: US 11,973,162 B2
(45) Date of Patent: Apr. 30, 2024

(54) MANUFACTURING METHOD FOR FLEXIBLE SILICON-BASED CELL MODULE

(71) Applicant: Golden Solar (Quanzhou) New Energy Technology Co., Ltd., Quanzhou (CN)

(72) Inventor: Hsin-wang Chiu, Quanzhou (CN)

(73) Assignee: GOLDEN SOLAR (QUANZHOU) NEW ENERGY TECHNOLOGY CO., LTD., Quanzhou (CN)

( * ) Notice: Subject to any disclaimer, the term of this patent is extended or adjusted under 35 U.S.C. 154(b) by 224 days.

(21) Appl. No.: 17/456,889

(22) Filed: Nov. 30, 2021

(65) Prior Publication Data

US 2023/0170433 A1    Jun. 1, 2023

(51) Int. Cl.
| | | |
|---|---|---|
| *H01L 31/18* | (2006.01) | |
| *H01L 31/02* | (2006.01) | |
| *H01L 31/04* | (2014.01) | |
| *H01L 31/048* | (2014.01) | |
| *H01L 31/05* | (2014.01) | |
| *H02S 30/20* | (2014.01) | |

(52) U.S. Cl.
CPC ........ *H01L 31/182* (2013.01); *H01L 31/0488* (2013.01); *H01L 31/0504* (2013.01); *H02S 30/20* (2014.12)

(58) Field of Classification Search
CPC ..... H01L 31/022433; H01L 31/022441; H01L 31/042; H01L 31/048; H01L 31/0488; H01L 31/0504; H01L 31/0512; H01L 31/0516; H01L 31/182; H02S 30/20
See application file for complete search history.

(56) References Cited

U.S. PATENT DOCUMENTS

| | | | | |
|---|---|---|---|---|
| 2014/0318611 | A1* | 10/2014 | Moslehi | H01L 31/0516 438/98 |
| 2015/0083192 | A1* | 3/2015 | Nobori | H01L 31/076 136/246 |
| 2015/0295109 | A1* | 10/2015 | Nobori | H01L 31/0543 136/246 |
| 2016/0126363 | A1* | 5/2016 | Sun | H01L 31/0488 438/66 |
| 2019/0296171 | A1* | 9/2019 | Chang | H01L 31/02008 |
| 2022/0271709 | A1* | 8/2022 | Dechaumphai | H01L 31/02 |

* cited by examiner

*Primary Examiner* — Omar F Mojaddedi
(74) *Attorney, Agent, or Firm* — Bayramoglu Law Offices LLC

(57) ABSTRACT

A manufacturing method for a flexible silicon-based cell module is provided. Specifically, cell units of a silicon-based solar cell structure are arranged and adhered to a connecting strip to form a cell string, wherein a gap is left between two adjacent cell units. The cell units in cell strings are connected in series and parallel by an interconnected bar, wherein a gap is left between two adjacent cell strings. Hard protection units adapted to the size and specification of the cell units are respectively attached to the cell units. A plurality of cell strings are connected to each other in series and parallel to form a cell assembly. A panel made of flexible material is selected to package the cell assembly to form the flexible cell module. The cell module has an excellent rollable performance and a flexible expansion, a light weight, and a small size.

20 Claims, 18 Drawing Sheets

MANUFACTURING METHOD FOR FLEXIBLE SILICON-BASED CELL MODULE

CROSS REFERENCE TO THE RELATED APPLICATIONS

This application is a new application filing in US by PARIS CONVENTION without claiming priority.

TECHNICAL FIELD

The present invention relates to a manufacturing method for a flexible silicon-based cell module.

BACKGROUND

According to the shape, solar cells can be divided into rigid solar cells and flexible solar cells. Compared with the rigid flexible cells, the flexible solar cells usually have the advantages of light weight, low installation cost, and a wide range of applications. At present, the flexible solar cells include amorphous silicon flexible cells, copper indium gallium selenide (CIGS) thin-film cells, and others. However, among them, the conversion efficiency of the amorphous silicon flexible cells is obviously low, thereby having a relatively limited commercial application, and the CIGS thin-film cells are singularly expensive to produce, which cannot be widely promoted.

Recently, with the continuous reduction of production costs and the continuous improvement of conversion efficiency due to the continuous improvement of the production technology of the solar cells, the power generation of the solar cells is increasingly widely used and has become an important source of power supply. Specifically, silicon-based solar cells have the maturest development, occupy a dominant position in the application, and gradually have the conditions to access to the power grid at a low price. However, the silicon-based solar cells are difficult to be made into flexible solar cells because of the fragile properties after bending, so that rigid packaging structures (such as glass packaging) are generally used to package the silicon-based solar cells to form the rigid solar cells, which results in that the expansion of the application range of the silicon-based solar cells is restricted by the weight, thickness, bending resistance, portability, and other factors after packaging.

SUMMARY

An objective of the present invention is to provide a manufacturing method for a flexible silicon-based cell module, wherein a silicon-based solar cell taking a silicon wafer as a base is used in the module manufacturing, which not only ensures a high conversion efficiency, but also has an excellent rollable performance and a flexible expansion, a light weight, a small size, and is convenient for transportation and storage.

The objective of the present invention is achieved by the following technical solutions.

A manufacturing method for a flexible silicon-based cell module is provided. Cell units of a silicon-based solar cell structure with a size and specification of 1-30 mm in length and 1-30 mm in width are arranged and adhered to a connecting strip to form a cell string, wherein a gap is left between two adjacent cell units. The cell units in a cell string and/or the cell units on different cell strings are connected in series and/or in parallel by an interconnected bar, wherein a gap is left between two adjacent cell strings. Hard protection units adapted to the size and specification of the cell units are respectively attached to the cell units, that is, the hard protection units are respectively attached on the front and/or back of the cell units. A plurality of cell strings are connected to each other in series and/or in parallel through a bus bar to form a cell assembly. A panel made of flexible material is selected to package the cell assembly to form the flexible cell module.

Compared with the Prior Art, the Present Invention has the Advantages:

(1) The whole silicon-based solar cell piece is divided into cell units with a relatively small size, and then arranged with a gap in series and parallel to form a cell assembly that meets the requirements of power output. By dividing the fragile silicon-based solar cell into parts, the cell assembly can be rollable while ensuring high conversion efficiency.

(2) The operation of attaching the hard protection units to the cell units is performed without affecting the series-parallel connection of the cell units, which ensures that the cell units do not bend when the flexible silicon-based cell module is rolled and avoids that module power decays or fails caused by fragmentation of the cell units.

(3) Since the interconnected bar is made of FCCL or FPCB material, the interconnected bar is flexible and can be rolled arbitrarily without breaking, which ensures the rollable service life of the interconnected bar.

Figure 1:
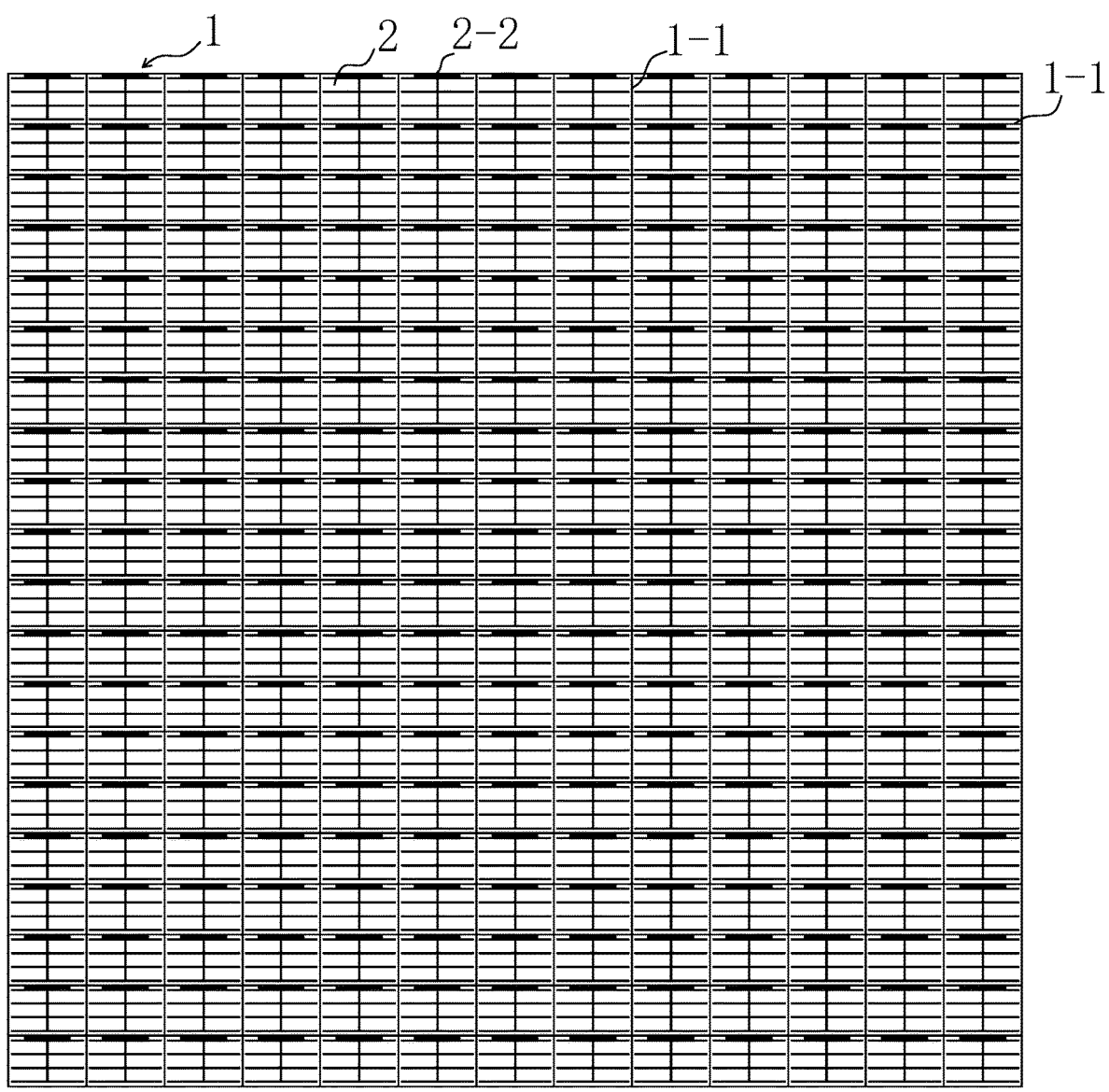
FIG. 1 is a first schematic diagram of a manufacturing process according to Embodiment 1 of the present invention.

Numerical reference: 1 whole cell piece, 1-1 cell fragmenting line, 2 cell unit, 2-1 gate electrode, 2-2 gate electrode welding point, 3 connecting strip, 4 cell string, 5 interconnected bar, 6 whole glass piece, 6-1 protection piece fragmenting line, 7 glass unit, 8 bus bar, 8-1 break point, 9 cell assembly, 10 first flexible plate, 11 first hot melt adhesive layer, 12 second hot melt adhesive layer, 13 second flexible plate, 14 optical silica gel.

DETAILED DESCRIPTION OF THE EMBODIMENTS

A manufacturing method for a flexible silicon-based cell module is provided, wherein cell units of a silicon-based solar cell structure with a size and specification of 1-30 mm in length and 1-30 mm in width are arranged and adhered to a connecting strip to form a cell string, wherein a gap is left between two adjacent cell units. The cell units in a cell string and/or the cell units on different cell strings are connected in series and/or in parallel by an interconnected bar, wherein a gap is left between two adjacent cell strings. Hard protection units adapted to the size and specification of the cell units are respectively attached to the cell units, that is, the hard protection units are respectively attached on the front and/or back of the cell units. A plurality of cell strings are connected to each other in series and/or in parallel through a bus bar to form a cell assembly; and a panel made of flexible material is selected to package the cell assembly to form the flexible cell module.

The hard protection units are made of glass, polycarbonate (PC), polymethyl methacrylate (PMMA), polypropylene (PP), polyethylene terephthalate (PET), or transparent fluorine material layer and have a thickness of 0.1-2 mm. The silicon-based solar cell is a monocrystalline silicon cell, a polycrystalline silicon cell, a silicon-based hetero-junction cell, a passivated emitter and rear cell (PERC), a passivated emitter and rear locally-diffused (PERL) cell, a passivated emitter and rear totally diffused cell (PERT), a tunnel oxide passivating contacts cell (TOPCon), an interdigitated back contact (IBC) cell, or an interdigitated back contact hetero-junction solar cell (HBC).

The connecting strip is a high temperature resistant adhesive tape which can withstand a high temperature above 120° C., such as rubber-based series, silicone-based series, acrylic-based series, or self-adhesive sticker series.

The material of the interconnected bar and the bus bar is a flexible copper clad laminate (FCCL) or a flexible printed circuit board (FPCB), and a surface of the material is tin-plated or tin-sprayed. The tin-plated operation is electrotinning, hot tinning, or the like.

The manufacturing method for the flexible silicon-based cell module includes the following steps.

Step S1: a whole silicon-based solar cell piece is obtained. The whole cell piece includes a plurality of cell units, and the size and specification of each of the cell units is 1-30 mm in length and 1-30 mm in width.

Step S2: the whole cell piece is fragmented into the cell units.

Step S3: the cell units are arranged and adhered to the connecting strip to form the cell string.

Step S4: the positive electrode and the negative electrode of the cell units of the cell string are correspondingly welded through the interconnected bar.

Step S5: the hard protection units adapted to the size and specification of the cell units are respectively attached on the front and/or back of the cell units.

Step S6: a plurality of cell strings are connected to each other in series and/or in parallel to form the cell assembly, wherein the gap is left between the two adjacent cell strings.

Step S7: a first flexible plate, a first hot melt adhesive layer, the cell assembly, a second hot melt adhesive layer, and a second flexible plate are stacked sequentially and laminated to form the flexible cell module.

The first flexible plate is positioned on the front of the cell assembly, and adopts a transparent material such as ethylene tetra fluoro ethylene (ETFE), polyethylene terephthalate (PET), polyethylene naphthalate two formic acid glycol ester (PEN), polyvinylidene fluoride (PVDF), or fluorinated transparent film. The second flexible plate is located on the back of the cell assembly, and is made of ethylene tetra fluoro ethylene (ETFE), polyimide film (PI), polyethylene terephthalate (PET), polyethylene naphthalate two formic acid glycol ester (PEN), polyvinylidene fluoride (PVDF), or fluorinated composite film. The first hot melt adhesive layer and the second hot melt adhesive layer are ethylene vinyl acetate copolymer (EVA), surlyn, or polyolefin encapsulant (POE).

Step S2 specifically includes the following.

S201: the whole cell piece is trimmed to meet a required overall size for fragmenting.

S202: the whole cell piece is scribed to form the cell fragmenting line according to the size and specification of the cell units.

S203: the whole cell piece is fragmented along the cell fragmenting line to form the cell units independent from each other.

In step S3, the gap between the two adjacent cell units is 0.1-2 mm, and each cell string includes 2-50 cell units.

A method of step S5 is that a hard protection piece is fragmented to form the hard protection units adapted to the size and specification of the cell units and the hard protection units are attached to one side of the cell units.

Step S5 specifically includes:

S501: the hard protection piece is scribed by an automatic scribing machine, and is fragmented into the hard protection units through a fragment mechanism.

S502: an adhesive-dripping operation or an adhesive-coating operation is performed on one side of the cell units.

S503: the hard protection units are arranged and attached to an adhesive-dripped surface or an adhesive-coated surface of the cell units, and then the cell units are baked; the interconnected bar is trimmed, so that the extending ends of the interconnected bar at the positive electrode and the interconnected bar at the negative electrode are located on different sides.

Step S6 specifically includes:

S601: the bus bar corresponding to the interconnected bar at two ends of the cell strings is laid on a welding plane, and at least one fixed strip is laid at the middle to adhere and fix the cell strings, wherein the tin-plated surface of the bus bar faces up. In a preferred solution, the fixed strip is a high temperature resistant adhesive tape which can withstand a high temperature above 120° C.

S602: the cell strings are arranged along the extension direction of the fixed strip, and after each plurality of cell strings are arranged, the interconnected bar connected to the bus bar on the corresponding side is changed once. After the arrangement of the cell strings is finished, the bus bar and the interconnected bar are welded.

S603: the bus bar is cut off according to the connection condition to finally form a working circuit of the cell assembly.

The gap between the two adjacent cell strings is 0.1-2 mm.

In step S602, the interconnected bar and the bus bar are welded by laser, hot pressing welding, or reflow soldering. Alternatively, in step S602, after the arrangement of the cell strings is completed, the tin-plated surface of another bus bar is attached to the bus bar on the welding plane to clamp the interconnected bar at the middle, and the interconnected bar at the middle is electrically connected to the bus bars arranged vertically opposite to each other by laser welding, hot pressing welding, or reflow soldering.

The manufacturing method for the flexible silicon-based cell module includes the following steps.

Step P1: the whole silicon-based solar cell piece with a back electrode structure or a back contact structure is obtained. The size and specification of the cell units is 1-30 mm in length and 1-30 mm in width.

Step P2: the whole cell piece is scribed to form the cell fragmenting line according to the size and specification of the cell units, and the hard protection piece is scribed to form the protection piece fragmenting line according to the size and specification of the cell units.

Step P3: the hard protection piece is attached and fixed on the front of the whole cell piece, wherein the cell fragmenting line is coincided with the protection piece fragmenting line.

Step P4: the whole cell piece attached with the hard protection piece is fragmented, and then arranged and adhered to the connecting strip to form the cell string, wherein the gap is left between the two adjacent cell units.

Step P5: the cell units in a cell string and/or the cell units on different cell strings are connected in series and/or in parallel by the interconnected bar, and the cell strings are connected in series and/or in parallel by the bus bar on a side of the cell strings to form the cell assembly, wherein the gap is left between the two adjacent cell strings.

Step P6: the first flexible plate, the first hot melt adhesive layer, the cell assembly, the second hot melt adhesive layer, and the second flexible plate are stacked sequentially and laminated to form the flexible cell module.

Step P3 specifically includes the following: the surface of the hard protection piece is subjected to an adhesive-dripping operation or an adhesive-coating operation; the whole cell piece is aligned and attached with the hard protection piece, wherein the cell fragmenting line is coincided with the protection piece fragmenting line.

Step P4 specifically includes the following: the whole cell piece attached with the hard protection piece is separated row by row; the cell units in a single row are fragmented and arranged, and adhered to the connecting strip to form the cell string; the connecting strip is adhered to the middle of the back of the cell units; a gap of 0.1-2 mm is left between the two adjacent cell units.

Step P5 specifically includes:

P501: after series connection and/or parallel connection between the cell units is completed by the interconnected bar, the bus bar corresponding to the interconnected bar extended from the cell string is laid on the welding plane, and at least one fixed strip is laid at the middle to adhere and fix the cell strings, wherein the tin-plated surface of the bus bar faces up. In a preferred solution, the fixed strip is a high temperature resistant adhesive tape which can withstand a high temperature above 120° C.

P502: the cell strings are arranged along the extension direction of the fixed strip, and after each plurality of cell strings are arranged, the interconnected bar connected to the bus bar on the corresponding side is changed once. After the arrangement of the cell strings is finished, the bus bar and the interconnected bar are welded.

P503: the bus bar is cut off according to the connection condition to finally form a working circuit of the cell assembly.

The gap between the two adjacent cell strings is 0.1-2 mm.

In step P502, the interconnected bar and the bus bar are welded by laser, hot pressing welding, or reflow soldering. Alternatively, in step P502, after the arrangement of the cell strings is completed, the tin-plated surface of another bus bar is attached to the bus bar on the welding plane to clamp the interconnected bar at the middle, and the interconnected bar at the middle is electrically connected to the bus bars arranged vertically opposite to each other by laser welding, hot pressing welding, or reflow soldering.

The first flexible plate is positioned on the front of the cell assembly, and adopts a transparent material such as ethylene tetra fluoro ethylene (ETFE), polyethylene terephthalate (PET), polyethylene naphthalate two formic acid glycol ester (PEN), polyvinylidene fluoride (PVDF), or fluorinated transparent film. The second flexible plate is located on the back of the cell assembly, and is made of ethylene tetra fluoro ethylene (ETFE), polyimide film (PI), polyethylene terephthalate (PET), polyethylene naphthalate two formic acid glycol ester (PEN), polyvinylidene fluoride (PVDF), or fluorinated composite film. The first hot melt adhesive layer and the second hot melt adhesive layer are ethylene vinyl acetate copolymer (EVA), surlyn, or polyolefin encapsulant (POE).

Embodiment 1

The present invention is described in detail below in combination with the figures of the specification and the embodiment.

FIGS. 1 to 9 are schematic diagrams showing an embodiment of a manufacturing method for a flexible silicon-based cell module provided by the present invention.

The manufacturing method for the flexible silicon-based cell module includes the following steps.

Step S1: the whole solar cell 1 that has a silicon-based double-sided heterojunction is selected, and the whole cell piece 1 includes a plurality of cell units 2, and the size and specification of each of the cell units 2 is 20 mm in length and 13 mm in width.

Figure 2:
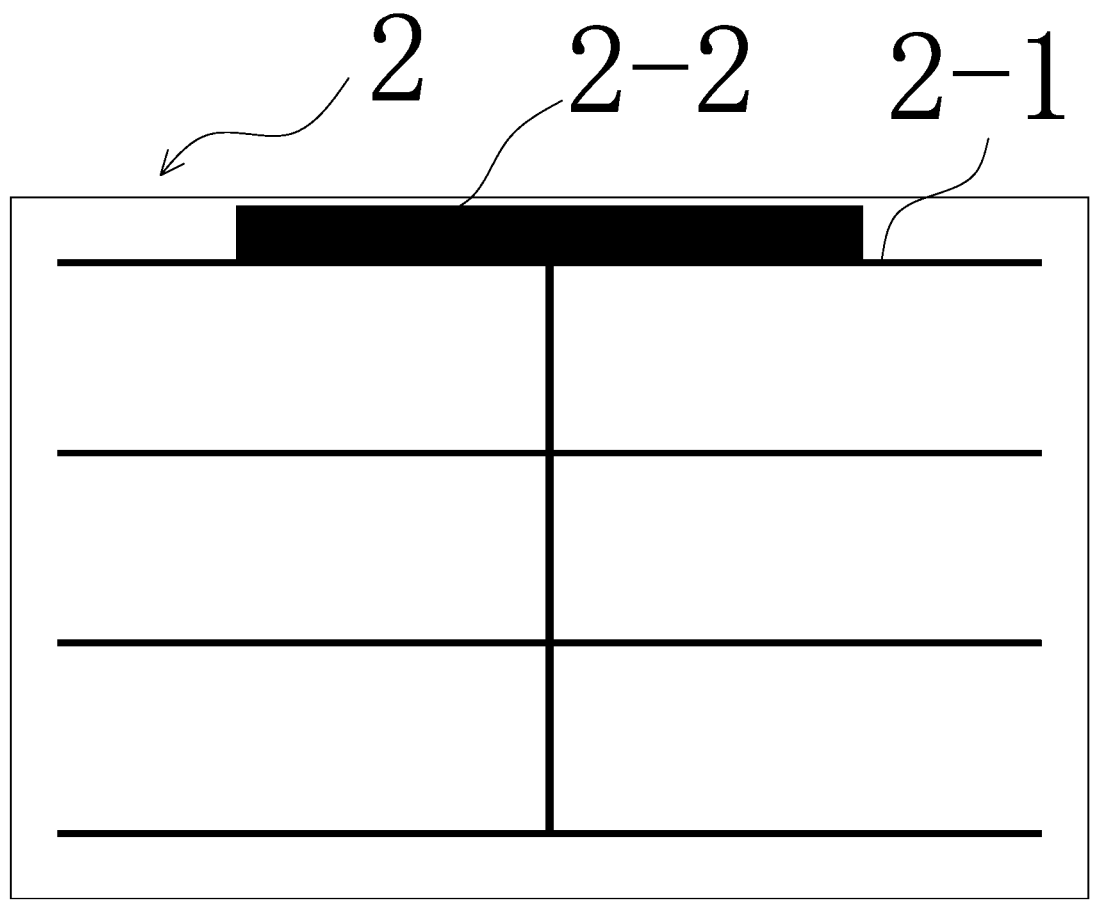
FIG. 2 is a structural schematic diagram showing a cell unit according to Embodiment 1 of the present invention.

Step S2: the surface of the whole cell piece 1 is scribed by laser to form the cell fragmenting line 1-1 according to the arrangement of each cell unit 2 on the whole cell piece 1, to form a structure as shown in FIG. 1; and the whole cell piece 1 is fragmented along the cell fragmenting line 1-1 to form the cell units 2 independent from each other, to form a structure as shown in FIG. 2.

Figure 3:
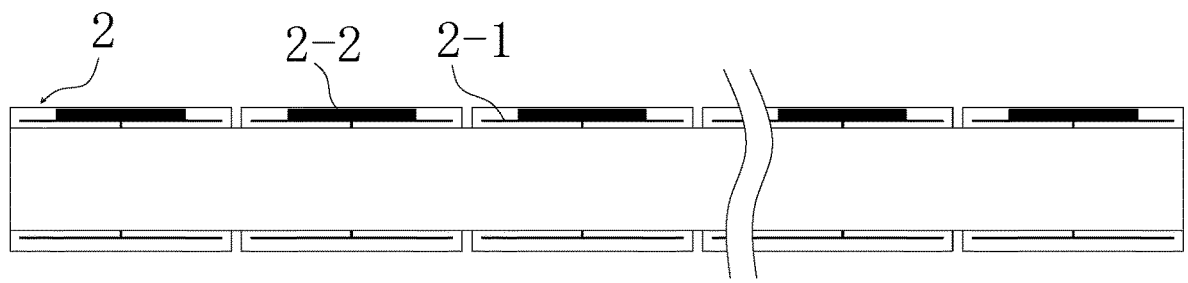
FIG. 3 is a second schematic diagram of the manufacturing process according to Embodiment 1 of the present invention.

Step S3: the cell units 2 are arranged by an arrangement machine according to the specification of thirteen cell units 2 per row with a gap of 0.2 mm, and adhered to the connecting strip 3 to form the cell string 4, and then the connecting strip 3 at two ends of the cell string 4 is cut off and trimmed smoothly; and as a limitation, an adhering position of the connecting strip 3 cannot cover the gate electrode welding point 2-2 of the cell units 2, to form a structure as shown in FIG. 3. The connecting strip 3 is a high temperature resistant adhesive tape.

Figure 4:
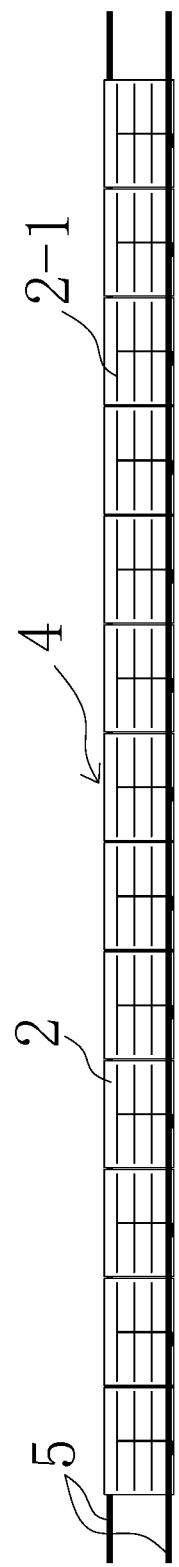
FIG. 4 is a third schematic diagram of the manufacturing process according to Embodiment 1 of the present invention.

Step S4: the front and back gate wire electrodes 2-1 of the cell units 2 on the cell string 4 are serially welded respectively through the FCCL interconnected bar 5, to form a structure as shown in FIG. 4.

Figure 5:
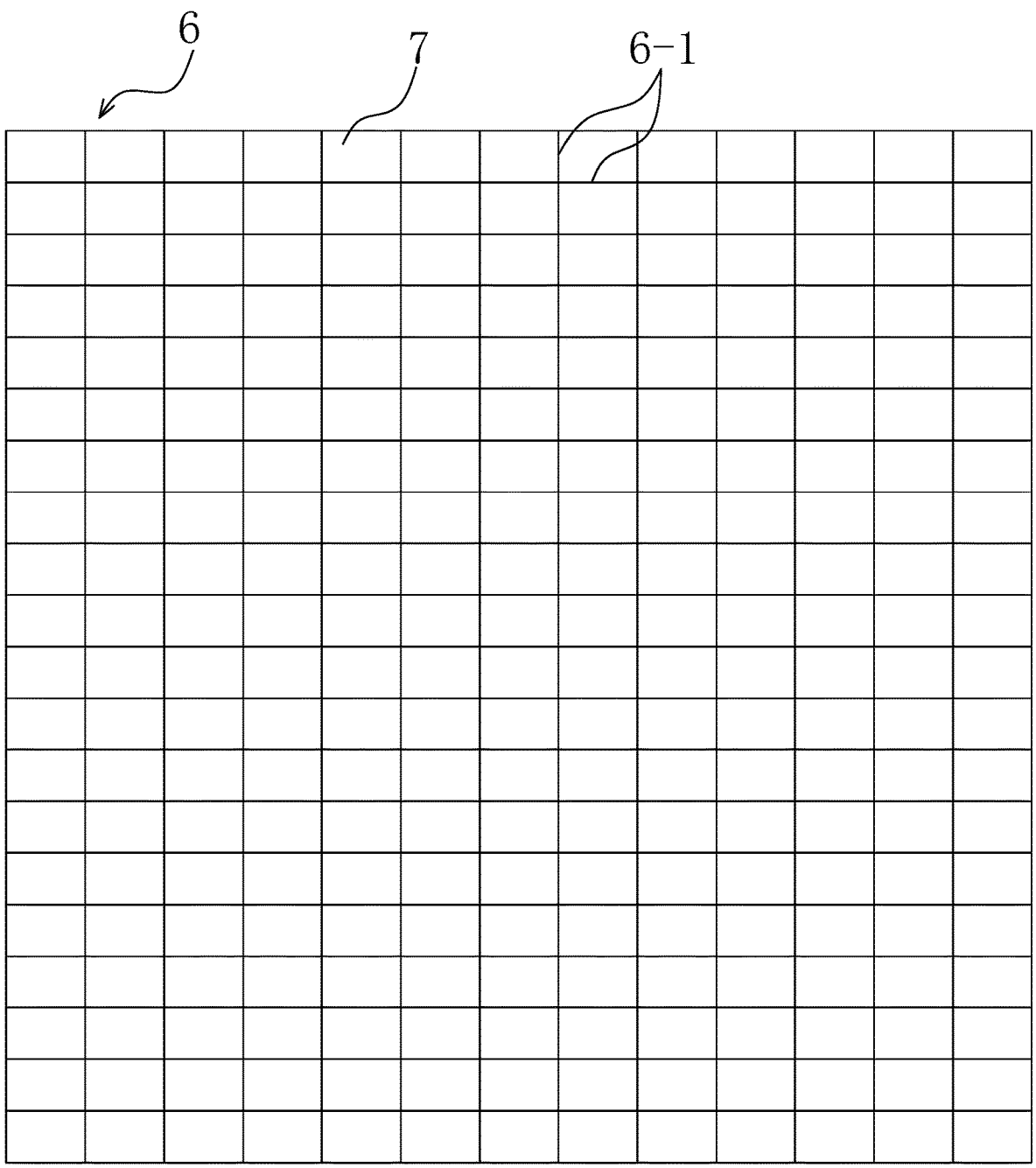
FIG. 5 is a fourth schematic diagram of the manufacturing process according to Embodiment 1 of the present invention.
Figure 6:
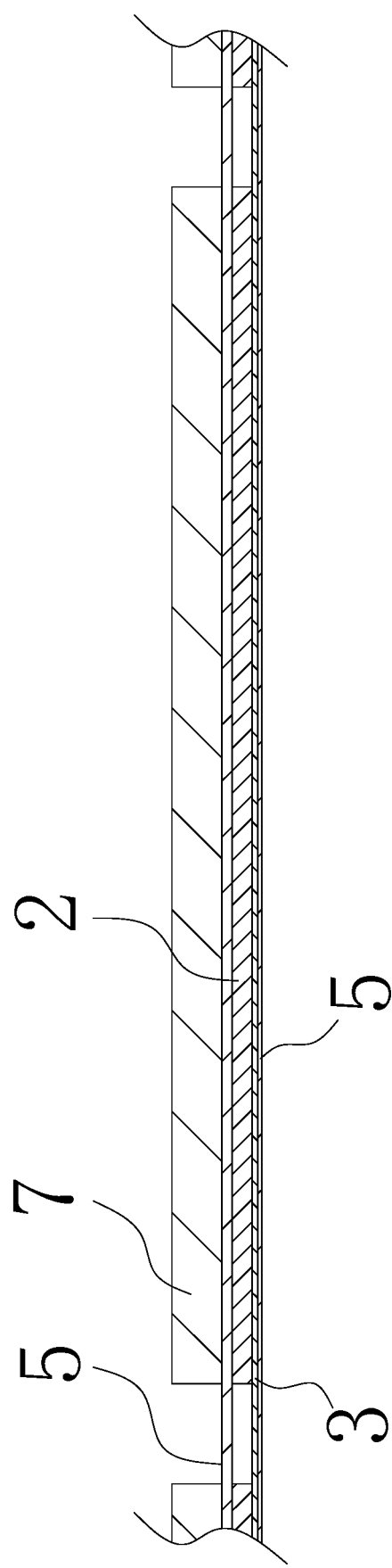
FIG. 6 is a fifth schematic diagram of the manufacturing process according to Embodiment 1 of the present invention, in which an optical silica gel is not shown.

Step S5: the whole glass piece 6 is selected, and the surface of the whole glass piece 6 is scribed by an automatic scribing machine to form the protection piece fragmenting line according to the size and specification of the cell units, to form a structure as shown in FIG. 5, which is vibrated and fragmented into the glass units 7 by a fragment mechanism. The adhesive-dripping operation is performed on the front of the cell units 2, and the adhesive adopts the optical silica gel 14. The glass units 7 flow out of a vibrating plate and is correspondingly attached to the adhesive-dripped front of the cell units 2 by an automatic arrangement machine, then the cell units 2 are baked, to form a structure as shown in FIG. 6, and the FCCL interconnected bar 5 is trimmed so that the extending ends of the FCCL interconnected bar 5 on the front and back of the cell units 2 are located on different sides.

Figure 7:
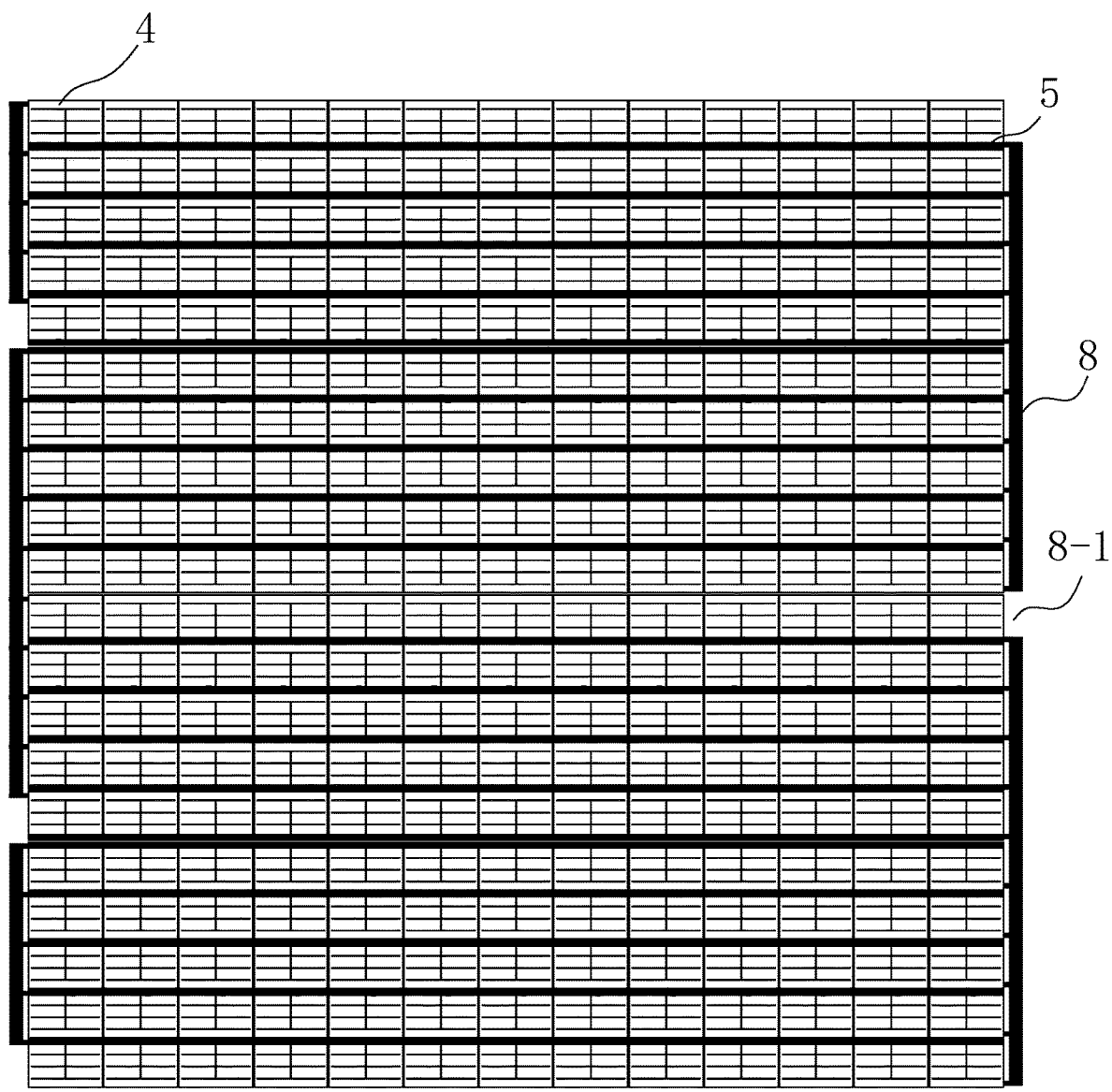
FIG. 7 is a sixth schematic diagram of the manufacturing process according to Embodiment 1 of the present invention, only showing a partial structure of a cell assembly without showing a glass unit.

In S601 of step S6, the FCCL bus bars 8 correspondingly connected to the FCCL interconnected bars 5 of two ends of the cell strings 4 are laid on two sides of the welding plane, and two fixed strips are laid at the middle, wherein the tin-plated surface of the FCCL bus bars 8 faces up. In S602, the cell strings 4 are arranged along the extension direction of the FCCL bus bar 8, the gap between the two adjacent cell strings 4 is 0.4 mm, and the surface attached with the glass units 7 faces up. After every five cell strings 4 are arranged, the FCCL interconnected bar 5 connected to the FCCL bus bar 8 on the corresponding side is changed once. After the arrangement of the cell strings 4 is completed, another FCCL bus bar 8 whose tin-plated surface faces down is aligned and attached with the FCCL bus bar 8 which is located on the welding plane and whose tin-plated surface faces up, to clamp the FCCL interconnected bar 5 at the middle for laser welding. In S603, the FCCL bus bar 8 is cut off according to the connection condition to finally form the working circuit of the cell assembly 9, to form a structure as shown in FIG. 7.

Figure 8:
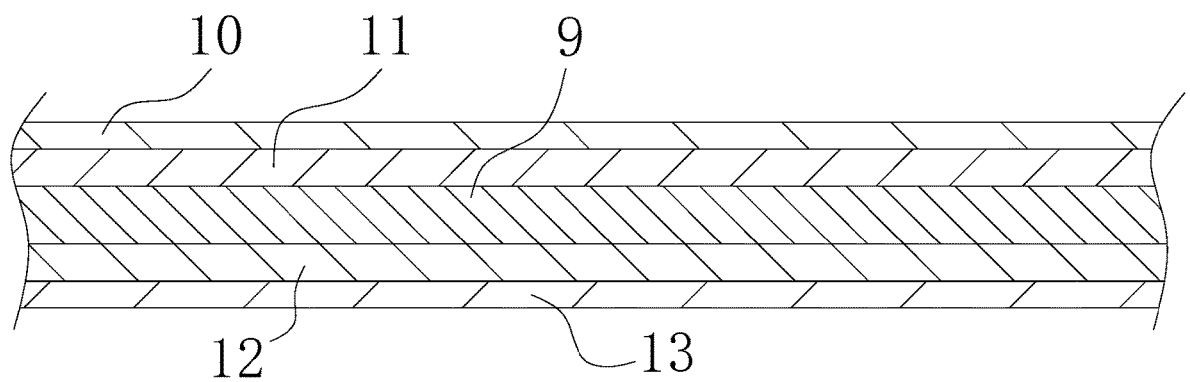
FIG. 8 is a cross-sectional diagram of a finished product according to Embodiment 1 of the present invention, in which a specific structure of a cell assembly is not shown.

Step S7: the first flexible plate 10, the first hot melt adhesive layer 11, the cell assembly 9, the second hot melt adhesive layer 12, and the second flexible plate 13 are sequentially stacked and laminated to form a flexible cell module, to form a structure as shown in FIG. 8. The first flexible plate 10 and the second flexible plate 13 are made of ETFE, and the first hot melt adhesive layer 11 and the second hot melt adhesive layer 12 are POE.

Figure 9:
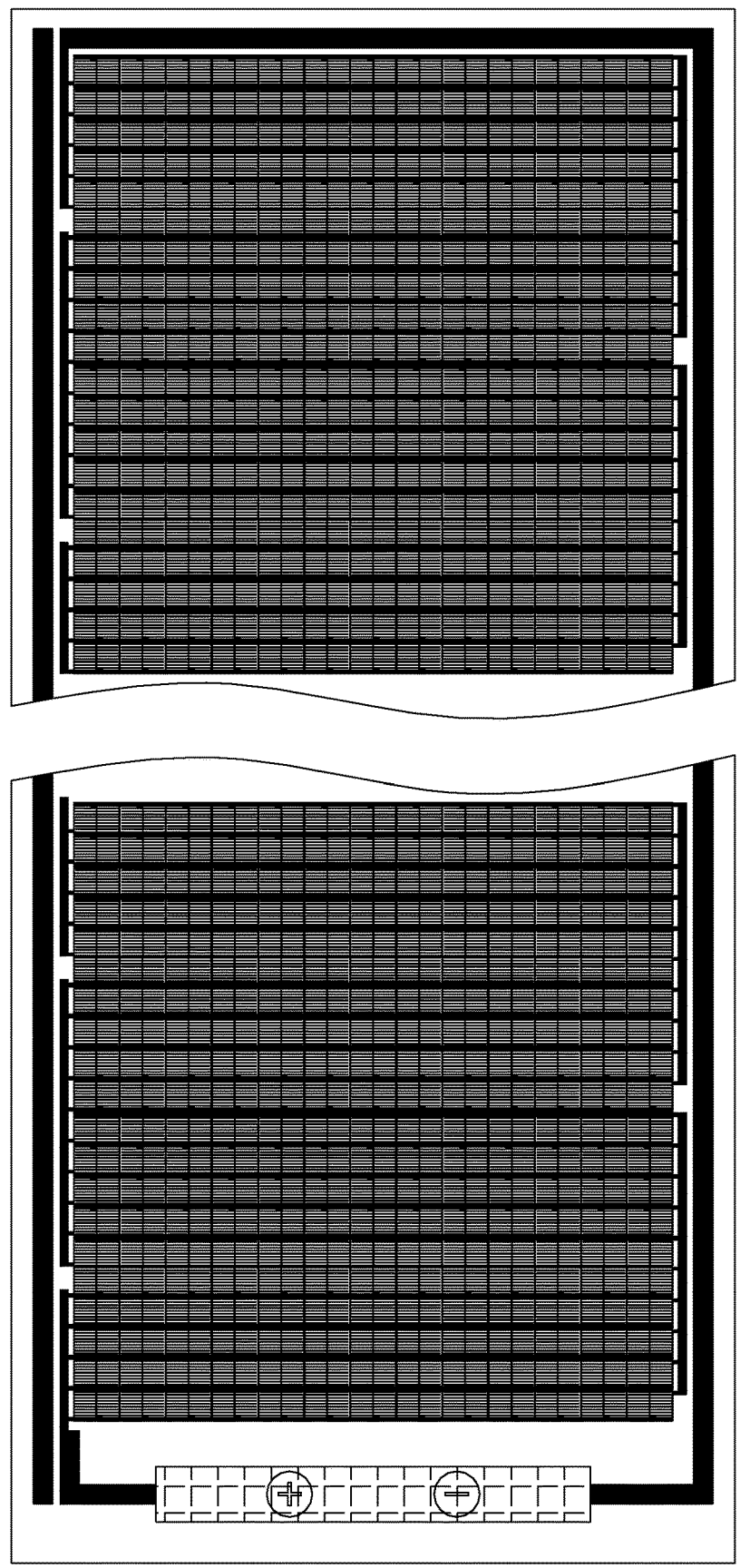
FIG. 9 is a structural schematic diagram of a finished product according to Embodiment 1 of the present invention, in which an outline of a transparent material structure is shown only with a frame line.

The flexible silicon-based cell module manufactured by the embodiment (as shown in FIG. 9) has a rollable diameter of less than 4 cm, and the cell does not crack and the power does not decay during rolling.

Embodiment 2

The present invention is described in detail below in combination with the figures of the specification and the embodiment:

FIGS. 10 to 18 are schematic diagrams showing an embodiment of a manufacturing method for a flexible silicon-based cell module provided by the present invention.

The manufacturing method for the flexible silicon-based cell module includes the following steps.

Step P1: the whole silicon-based solar cell piece 1 with a back gate structure is obtained, and the size and specification of the cell units 2 is 12 mm in length and 7.84 mm in width.

Figure 10:
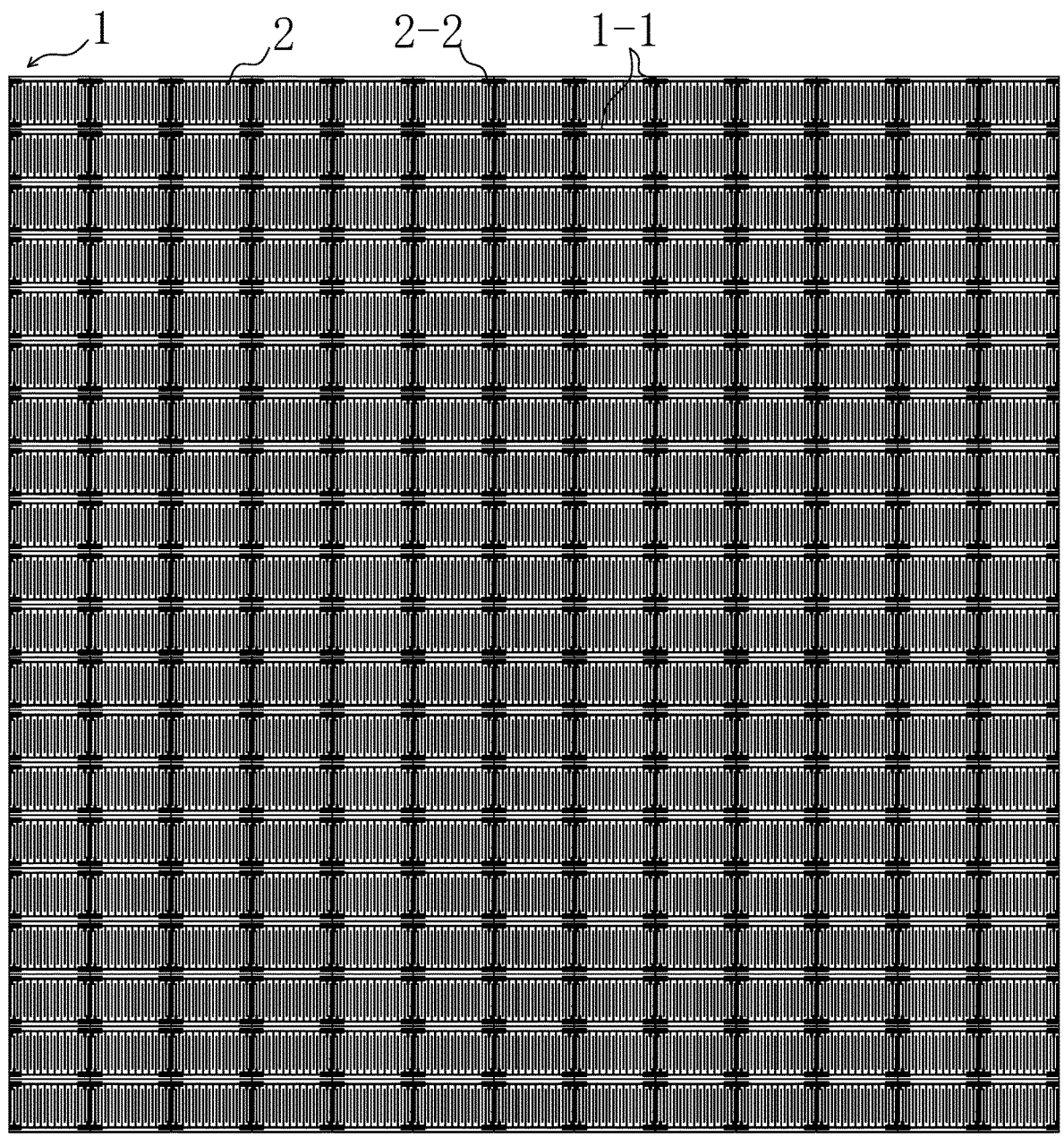
FIG. 10 is a first schematic diagram of a manufacturing process according to Embodiment 2 of the present invention, in which a whole silicon-based solar cell piece has a back gate structure.
Figure 11:
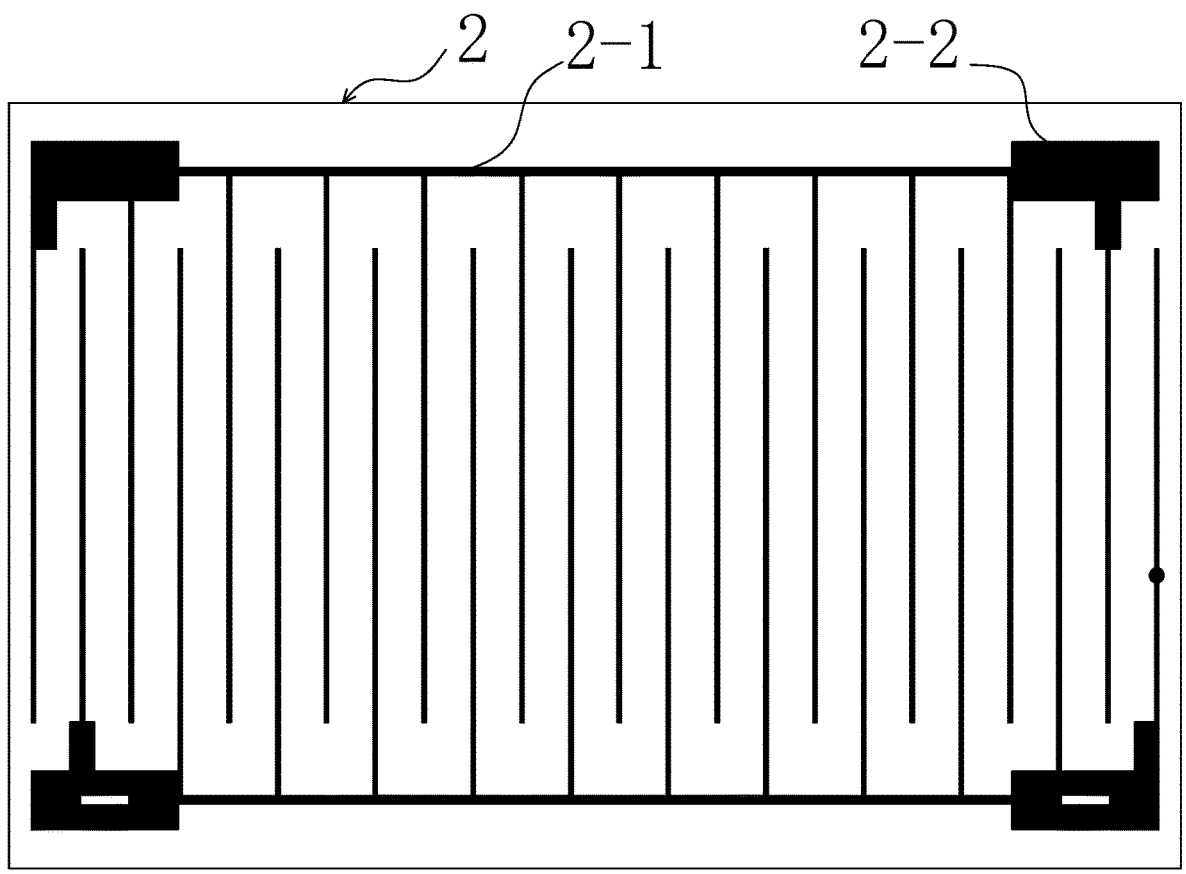
FIG. 11 is a second schematic diagram of the manufacturing process according to Embodiment 2 of the present invention.
Figure 12:
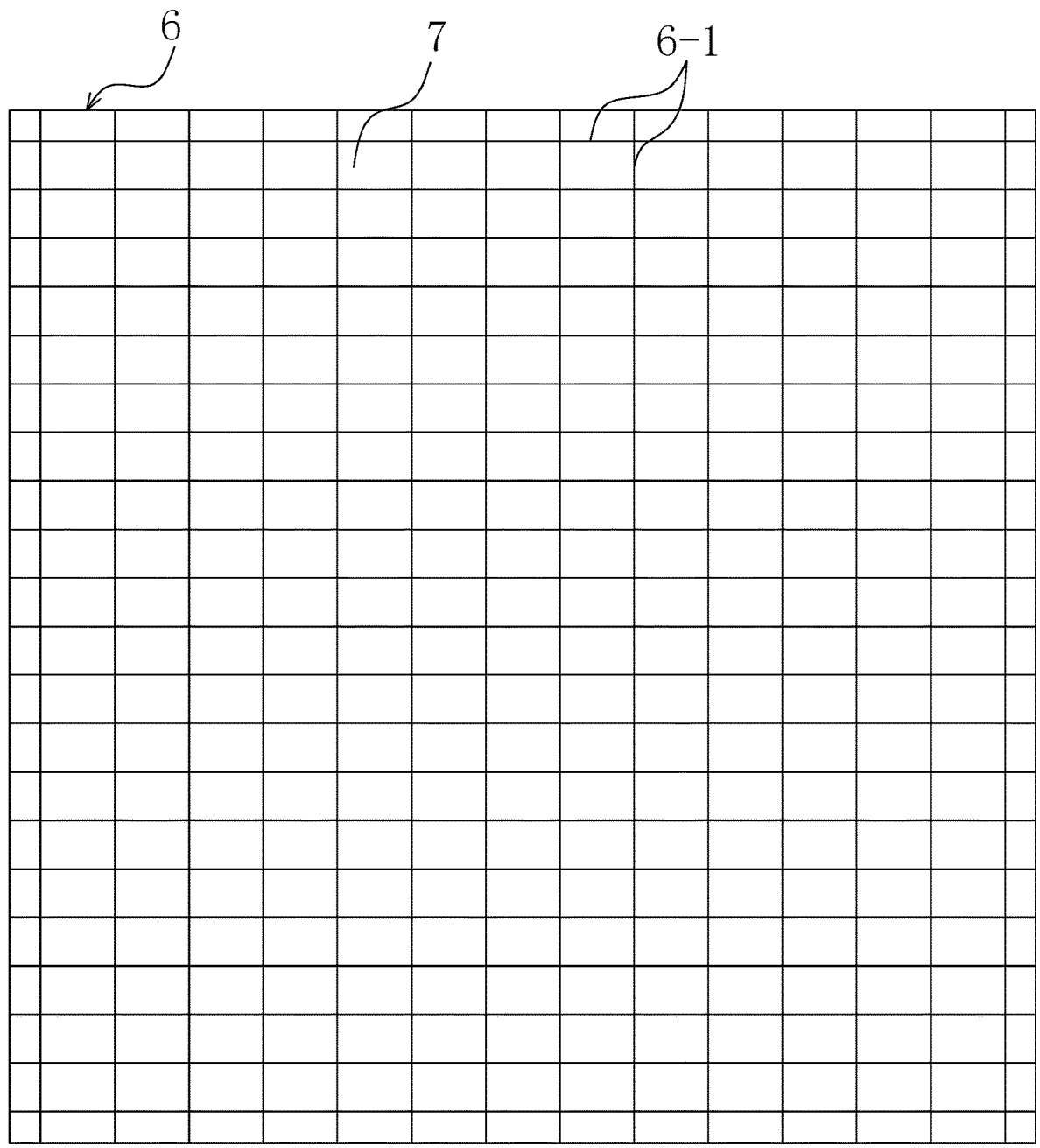
FIG. 12 is a third schematic diagram of the manufacturing process according to Embodiment 2 of the present invention.

Step P2: the front of the whole cell piece 1 is scribed by laser to form the cell fragmenting line 1-1 according to the arrangement of each cell unit 2 on the whole cell piece 1, to form a structure as shown in FIG. 10; and the surface of the whole glass piece 6 is scribed by a laser scribing machine or a mechanical scribing machine to form the protection piece fragmenting line 6-1 according to the size and specification of the cell units 2, to form a structure as shown in FIG. 12.

Figure 13:
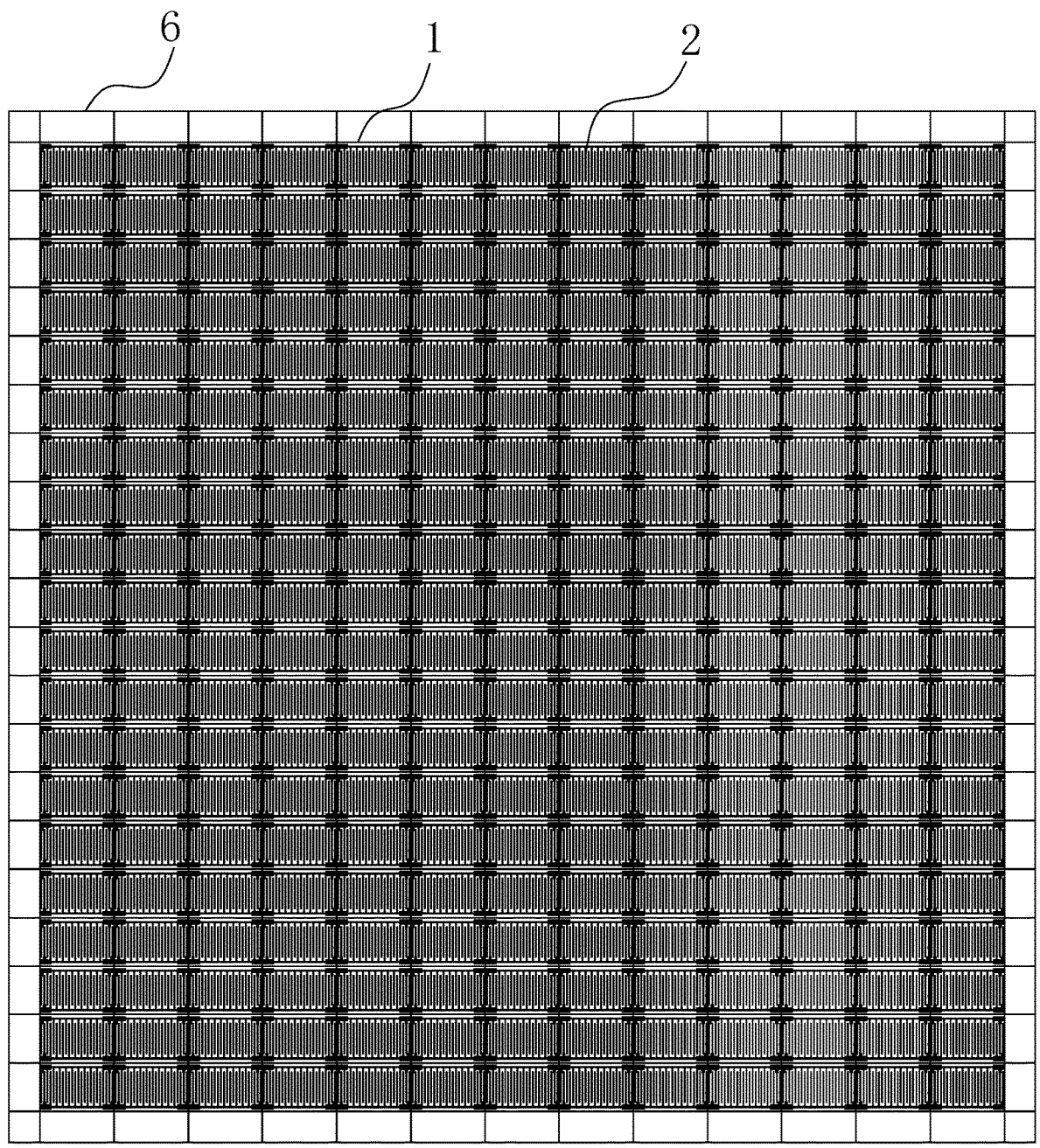
FIG. 13 is a fourth schematic diagram of the manufacturing process according to Embodiment 2 of the present invention.

Step P3: the adhesive is dripped on the front of the whole cell piece 1, and the whole glass piece 6 is aligned and attached with the whole cell piece 1, so that the cell fragmenting line 1-1 is coincided with the protection piece fragmenting line 6-1, to form a structure as shown in FIG. 13. The adhesive used in the adhesive-dripping operation is the optical silica gel 14.

Figure 14:
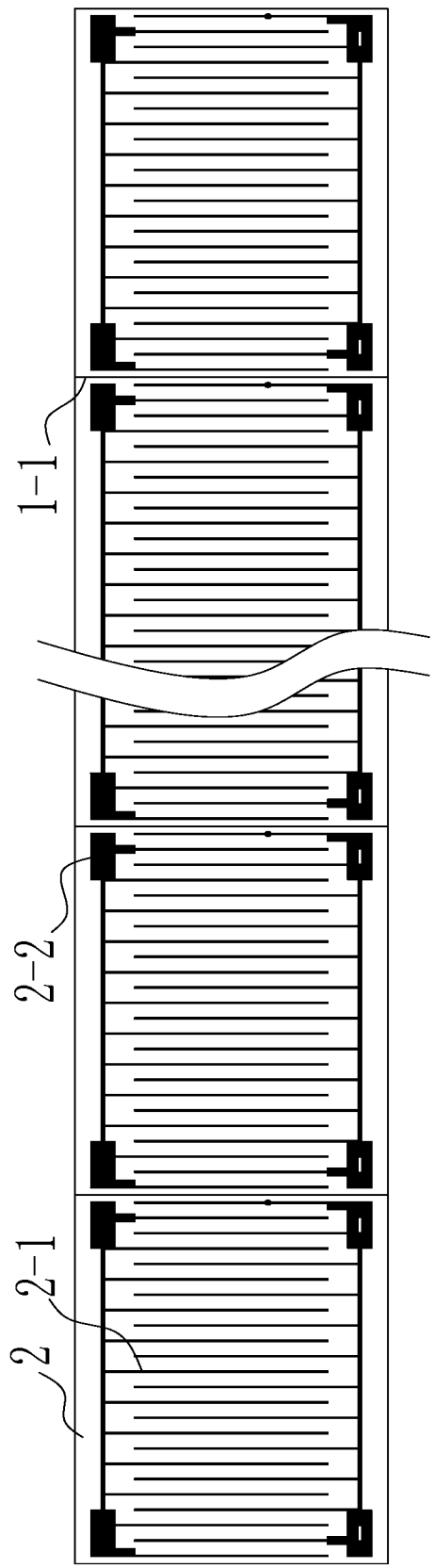
FIG. 14 is a fifth schematic diagram of the manufacturing process according to Embodiment 2 of the present invention.
Figure 15:
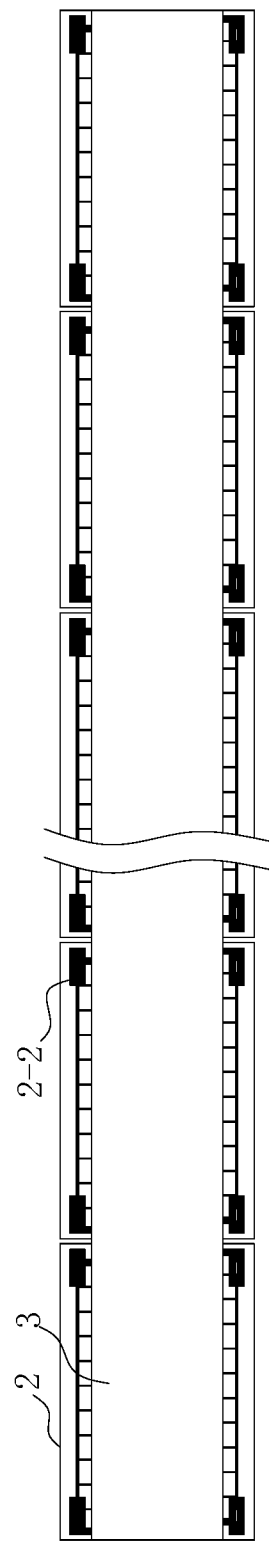
FIG. 15 is a sixth schematic diagram of the manufacturing process according to Embodiment 2 of the present invention.

Step P4: the whole cell piece 1 attached with the whole glass piece 6 is separated row by row, to form a structure as shown in FIG. 14. The cell units 2 in a single row are fragmented and arranged, and adhered to the connecting strip 3 to form the cell string 4; the connecting strip 3 is adhered to the middle of the back of the cell units 2, and only the positive and negative gate electrode welding points 2-2 are exposed on two sides of the connecting strip 3; and a gap of 0.1-2 mm is left between the two adjacent cell units 2, to form a structure as shown in FIG. 15.

Figure 16:
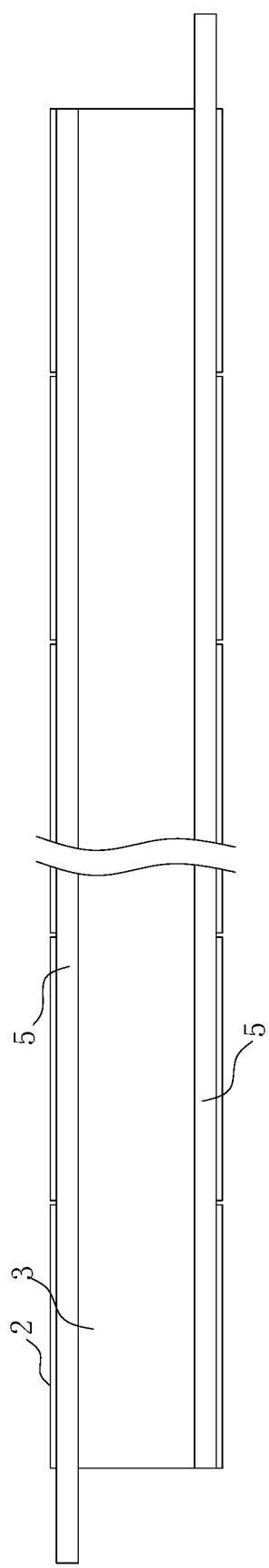
FIG. 16 is a seventh schematic diagram of the manufacturing process according to Embodiment 2 of the present invention.
Figure 17:
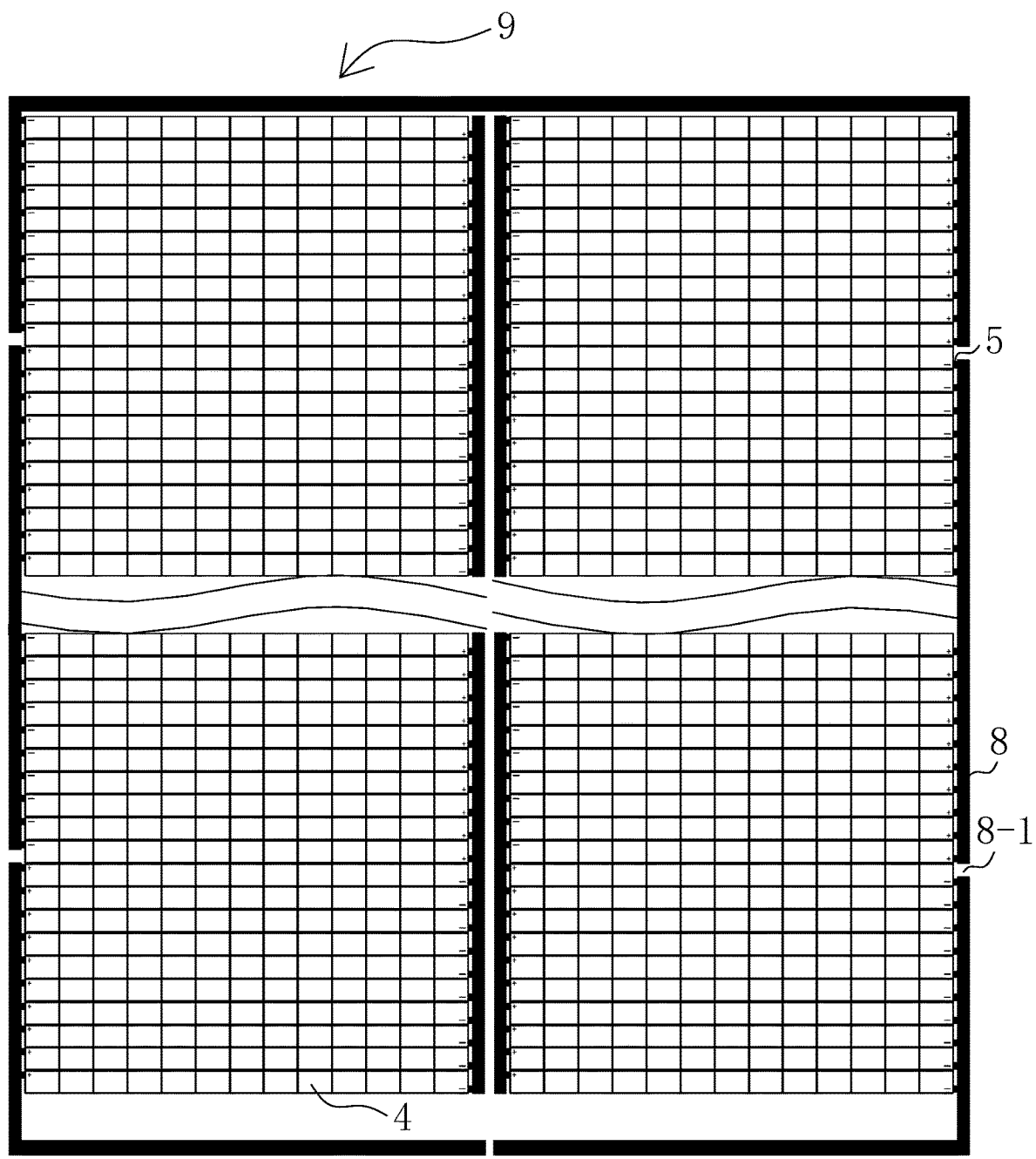
FIG. 17 is an eighth schematic diagram of the manufacturing process according to Embodiment 2 of the present invention.

Step P5: the cell units 2 in the cell strings 4 are connected in parallel by the FCCL interconnected bar 5, to form a structure as shown in FIG. 16. Then, the FCCL bus bars 8 are arranged on two sides of the cell strings 4; the cell strings 4 are arranged according to the combination of series and parallel connection, and correspondingly welded with the FCCL interconnected bar 5 and the FCCL bus bar 8. A gap of 0.1-2 mm is left between the two adjacent cell strings 4. After the arrangement and welding is completed to form the cell assembly 9, the FCCL bus bar 8 is cut off according to the requirement for parallel connection, to form a structure as shown in FIG. 17. A preferred welding solution for the corresponding welding of the FCCL interconnected bar 5 and the FCCL bus bar 8 is as follows: the FCCL bus bars 8 correspondingly connected to the FCCL interconnected bars 5 of two ends of the cell strings 4 are laid on two sides of the welding plane, and one fixed strip is laid at the middle, wherein the tin-plated surface of the FCCL bus bars 8 faces up; the cell strings 4 are arranged along the extension direction of the FCCL bus bar 8, the gap between the two adjacent cell strings 4 is 0.4 mm, and the surface attached with the glass units 7 faces up; after every five cell strings 4 are arranged, the FCCL interconnected bar 5 connected to the FCCL bus bar 8 on the corresponding side is changed once; after the arrangement of the cell strings 4 is completed, another FCCL bus bar 8 whose tin-plated surface faces down is aligned and attached with the FCCL bus bar 8 which is located on the welding plane and whose tin-plated surface faces up, to clamp the FCCL interconnected bar 5 at the middle for laser welding; the FCCL bus bar 8 is cut off according to the connection condition.

Figure 18:
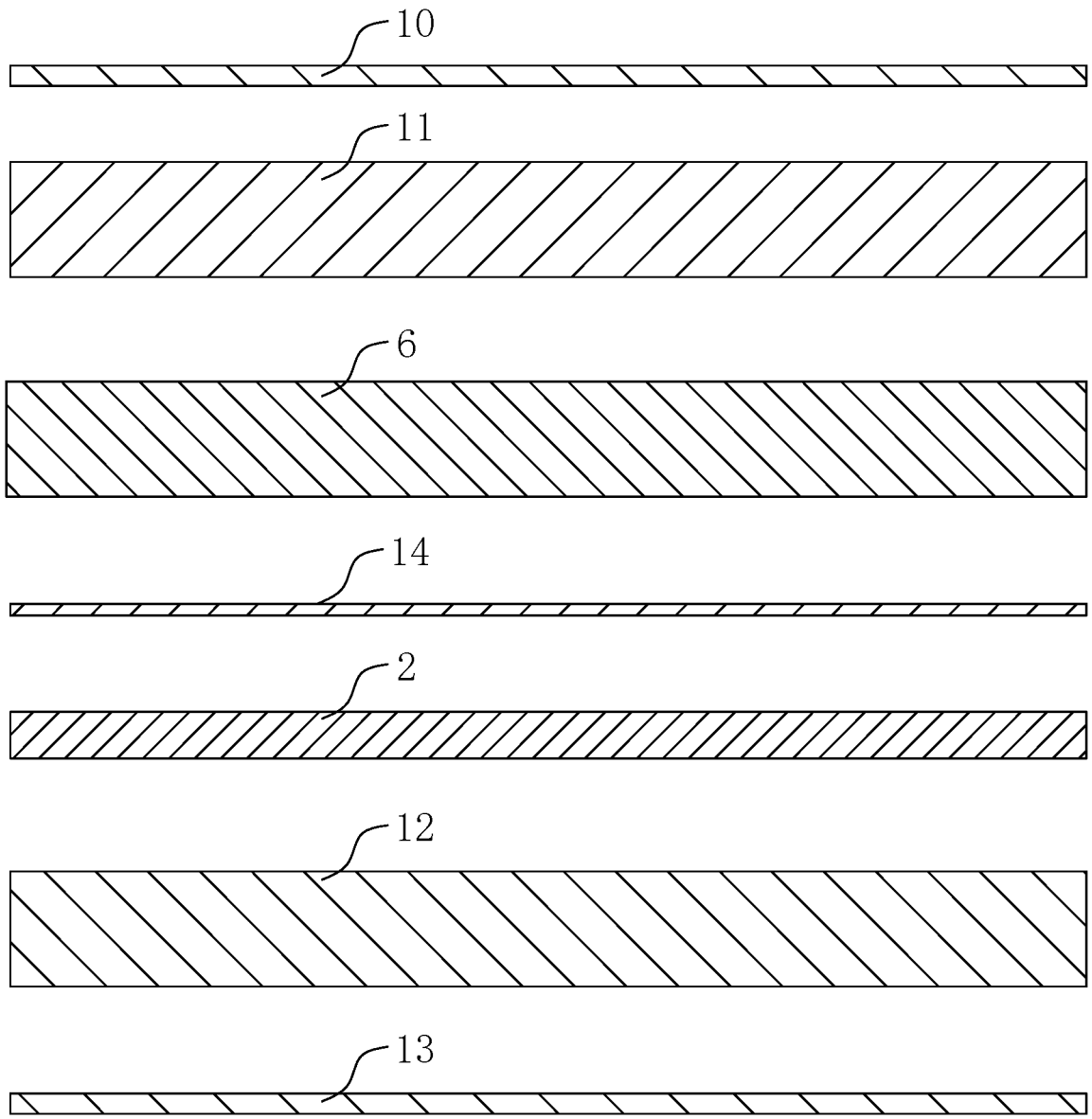
FIG. 18 is an exploded diagram showing each layer structure of a finished product according to Embodiment 2 of the present invention, in which structures such as an interconnected bar, a bus bar, and a connecting strip are not shown.

Step P6: the first flexible plate 10, the first hot melt adhesive layer 11, the cell assembly 9, the second hot melt adhesive layer 12, and the second flexible plate 13 are sequentially stacked and laminated to form a flexible cell module, to form a laminated structure as shown in FIG. 18.

The flexible silicon-based cell module manufactured by the embodiment has a rollable diameter of less than 4 cm, and the cell does not crack and the power does not decay during rolling.

In the present invention, "below" and "above", which represent the range of values, contain the value itself, for example, "above one" means "any integer equal to or larger than one".

What is claimed is:

1. A manufacturing method for a flexible silicon-based cell module, wherein a plurality of cell units of a silicon-based solar cell structure with a size and specification of 1-30 mm in a length and 1-30 mm in a width are arranged and adhered to a connecting strip to form a plurality of cell strings, wherein a first gap is left between two adjacent cell units of the plurality of cell units; the plurality of cell units in one of the plurality of cell strings are connected by an interconnected bar, wherein a second gap is left between two adjacent cell strings of the plurality of cell strings; hard protection units adapted to the size and specification of the plurality of cell units are respectively attached to the plurality of cell units, wherein the hard protection units are respectively attached on the plurality of cell units; the plurality of cell strings are connected to each other through at least one bus bar to form a cell assembly; and a panel made of a flexible material is selected to package the cell assembly to form the flexible silicon-based cell module.

2. The manufacturing method for the flexible silicon-based cell module according to claim 1, wherein the hard protection units are made of glass, polycarbonate (PC), polymethyl methacrylate (PMMA), polypropylene (PP), polyethylene terephthalate (PET), or a transparent fluorine material layer, and the hard protection units have a thickness of 0.1-2 mm; each of silicon-based solar cells of the plurality of cell units is a monocrystalline silicon cell, a polycrystalline silicon cell, a silicon-based hetero-junction cell, a passivated emitter and rear cell (PERC), a passivated emitter and rear locally-diffused (PERL) cell, a passivated emitter and rear totally diffused cell (PERT), a tunnel oxide passivating contacts cell (TOPCon), an interdigitated back contact (IBC) cell, or an interdigitated back contact hetero junction solar cell (HBC).

3. The manufacturing method for the flexible silicon-based cell module according to claim 1, wherein the connecting strip is a high temperature resistant adhesive tape configured to withstand a high temperature above 120° C.

4. The manufacturing method for the flexible silicon-based cell module according to claim 1, wherein a material of each of the interconnected bar and the at least one bus bar is a flexible copper clad laminate (FCCL) or a flexible printed circuit board (FPCB), and a surface of the material is tin-plated or tin-sprayed.

5. The manufacturing method for the flexible silicon-based cell module according to claim 1, comprising the following steps:

step S1: obtaining a whole silicon-based solar cell piece, wherein the whole silicon-based solar cell piece comprises the plurality of cell units, and the size and specification of each of the plurality of cell units is 1-30 mm in the length and 1-30 mm in the width;

step S2: fragmenting the whole silicon-based solar cell piece into the plurality of cell units;

step S3: arranging the plurality of cell units and adhering the plurality of cell units to the connecting strip to form the plurality of cell strings;

step S4: correspondingly welding a positive electrode of the plurality of cell units of the plurality of cell strings and a negative electrode of the plurality of cell units of the plurality of cell strings through the interconnected bar;

step S5: respectively attaching the hard protection units adapted to the size and specification of the plurality of cell units on the plurality of cell units;

step S6: connecting the plurality of cell strings to form the cell assembly, wherein the second gap is left between the two adjacent cell strings; and step S7: sequentially stacking and laminating a first flexible plate, a first hot melt adhesive layer, the cell assembly, a second hot melt adhesive layer, and a second flexible plate to form the flexible silicon-based cell module.

6. The manufacturing method for the flexible silicon-based cell module according to claim 5, wherein the first flexible plate is positioned on a front of the cell assembly, and the first flexible plate adopts a transparent material such as ethylene tetra fluoro ethylene (ETFE), polyethylene terephthalate (PET), polyethylene naphthalene two formic acid glycol ester (PEN), polyvinylidene fluoride (PVDF), or a fluorinated transparent film; the second flexible plate is located on a back of the cell assembly, and the second flexible plate is made of ETFE, a polyimide film (PI), PET, PEN, PVDF, or a fluorinated composite film; the first hot melt adhesive layer and the second hot melt adhesive layer are ethylene vinyl acetate copolymer (EVA), surlyn, or polyolefin encapsulant (POE).

7. The manufacturing method for the flexible silicon-based cell module according to claim 5, wherein step S2 specifically comprises:

S201: scribing the whole silicon-based solar cell piece to form a cell fragmenting line according to the size and specification of the plurality of cell units; and S202: fragmenting the whole silicon-based solar cell piece along the cell fragmenting line to form the plurality of cell units, wherein the plurality of cell units are independent from each other.

8. The manufacturing method for the flexible silicon-based cell module according to claim 7, wherein before step S201, the whole silicon-based solar cell piece is trimmed to meet a required overall size for fragmenting.

9. The manufacturing method for the flexible silicon-based cell module according to claim 5, wherein in step S3, the first gap between the two adjacent cell units is 0.1-2 mm, and each of the plurality of cell strings comprises 2-50 of the plurality of cell units.

10. The manufacturing method for the flexible silicon-based cell module according to claim 5, wherein a method of step S5 is that a hard protection piece is fragmented to form the hard protection units adapted to the size and specification of the plurality of cell units and the hard protection units are attached to one side of the plurality of cell units.

11. The manufacturing method for the flexible silicon-based cell module according to claim 10, wherein step S5 specifically comprises:

S501: scribing the hard protection piece by an automatic scribing machine, and fragmenting the hard protection piece into the hard protection units through a fragment mechanism;

S502: performing an adhesive-dripping operation or an adhesive-coating operation on the one side of the plurality of cell units; and S503: arranging and attaching the hard protection units to an adhesive-dripped surface or an adhesive-coated surface of the plurality of cell units, then baking the plurality of cell units, and trimming the interconnected bar, wherein an extending end of the interconnected bar at the positive electrode and an extending end of the interconnected bar at the negative electrode are located on different sides of the plurality of cell units.

12. The manufacturing method for the flexible silicon-based cell module according to claim 10, wherein step S6 specifically comprises:

S601: laying a first bus bar of the at least one bus bar corresponding to the interconnected bar at two ends of the plurality of cell strings on a welding plane, and laying at least one fixed strip at a middle of the welding plane to adhere and fix the plurality of cell strings, wherein a tin-plated surface of the first bus bar faces up;

S602: arranging the plurality of cell strings along an extension direction of the at least one fixed strip; after each of the plurality of cell strings are arranged, changing the interconnected bar connected to the first bus bar on a corresponding side of the plurality of cell strings once; and after an arrangement of the plurality of cell strings is finished, welding the first bus bar and the interconnected bar; and S603: cutting off the first bus bar according to a connection condition to finally form a working circuit of the cell assembly, wherein the second gap between the two adjacent cell strings is 0.1-2 mm.

13. The manufacturing method for the flexible silicon-based cell module according to claim 12, wherein in step S602, the interconnected bar and the first bus bar are welded by a laser welding, a hot pressing welding, or a reflow soldering; alternatively, in step S602, after the arrangement of the plurality of cell strings is completed, a tin-plated surface of a second bus bar of the at least one bus bar is attached to the first bus bar on the welding plane to clamp the interconnected bar at a middle of the first bus bar and the second bus bar, and the interconnected bar at the middle of the first bus bar and the second bus bar is electrically connected to the first bus bar and the second bus bar arranged vertically opposite to each other by the laser welding, the hot pressing welding, or the reflow soldering.

14. The manufacturing method for the flexible silicon-based cell module according to claim 1, comprising the following steps:

step P1: obtaining a whole silicon-based solar cell piece with a back electrode structure or a back contact structure; wherein the size and specification of the plurality of cell units is 1-30 mm in the length and 1-30 mm in the width;

step P2: scribing the whole silicon-based solar cell piece to form a cell fragmenting line according to the size and specification of the plurality of cell units, and scribing a hard protection piece to form a protection piece fragmenting line according to the size and specification of the plurality of cell units;

step P3: attaching and fixing the hard protection piece on a front of the whole silicon-based solar cell piece, wherein the cell fragmenting line is coincided with the protection piece fragmenting line;

step P4: fragmenting the whole silicon-based solar cell piece attached with the hard protection piece, and then arranging and adhering the whole silicon-based solar cell piece attached with the hard protection piece to the connecting strip to form the plurality of cell strings, wherein the first gap is left between the two adjacent cell units;

step P5: connecting the plurality of cell units in the one cell string by the interconnected bar, and connecting the plurality of cell strings by the at least one bus bar on a side of the plurality of cell strings to form the cell assembly, wherein the second gap is left between the two adjacent cell strings; and step P6: sequentially stacking and laminating a first flexible plate, a first hot melt adhesive layer, the cell assembly, a second hot melt adhesive layer, and a second flexible plate to form the flexible silicon-based cell module.

15. The manufacturing method for the flexible silicon-based cell module according to claim 14, wherein step P3 specifically comprises: performing an adhesive-dripping operation or an adhesive-coating operation on a surface of the hard protection piece; and aligning and attaching the whole silicon-based solar cell piece with the hard protection piece.

16. The manufacturing method for the flexible silicon-based cell module according to claim 14, wherein step P4 specifically comprises: separating the whole silicon-based solar cell piece attached with the hard protection piece row by row; fragmenting and arranging the plurality of cell units in a single row, and adhering the plurality of cell units in the single row to the connecting strip to form the plurality of cell strings; and adhering the connecting strip to middles of backs of the plurality of cell units; wherein the first gap of 0.1-2 mm is left between the two adjacent cell units.

17. The manufacturing method for the flexible silicon-based cell module according to claim 14, wherein step P5 specifically comprises:

P501: after a connection between the plurality of cell units is completed by the interconnected bar, laying a first bus bar of the at least one bus bar corresponding to the interconnected bar extended from the plurality of cell strings on a welding plane, and laying at least one fixed strip at a middle of the welding plane to adhere and fix the plurality of cell strings, wherein a tin-plated surface of the first bus bar faces up;

P502: arranging the plurality of cell strings along an extension direction of the at least one fixed strip; after each of the plurality of cell strings are arranged, changing the interconnected bar connected to the first bus bar on a corresponding side of the plurality of cell strings once; and after an arrangement of the plurality of cell strings is finished, welding the first bus bar and the interconnected bar; and P503: cutting off the first bus bar according to a connection condition to finally form a working circuit of the cell assembly, wherein the first gap between the two adjacent cell strings is 0.1-2 mm.

18. The manufacturing method for the flexible silicon-based cell module according to claim 17, wherein in step P502, the interconnected bar and the first bus bar are welded by a laser welding, a hot pressing welding, or a reflow soldering; alternatively, in step P502, after the arrangement of the plurality of cell strings is completed, a tin-plated surface of a second bus bar of the at least one bus bar is attached to the first bus bar on the welding plane to clamp the interconnected bar at a middle of the first bus bar and the second bus bar, and the interconnected bar at the middle of the first bus bar and the second bus bar is electrically connected to the first bus bar and the second bus bar arranged vertically opposite to each other by the laser welding, the hot pressing welding, or the reflow soldering.

19. The manufacturing method for the flexible silicon-based cell module according to claim 14, wherein the first flexible plate is positioned on a front of the cell assembly, and the first flexible plate adopts a transparent material such as ETFE, PET, PEN, PVDF, or a fluorinated transparent film; the second flexible plate is located on a back of the cell assembly, and the second flexible plate is made of ETFE, PI, PET, PEN, PVDF, or a fluorinated composite film; the first hot melt adhesive layer and the second hot melt adhesive layer are EVA, surlyn, or POE.

20. The manufacturing method for the flexible silicon-based cell module according to claim 2, comprising the following steps:
- step S1: obtaining a whole silicon-based solar cell piece, wherein the whole silicon-based solar cell piece comprises the plurality of cell units, and the size and specification of each of the plurality of cell units is 1-30 mm in the length and 1-30 mm in the width;
- step S2: fragmenting the whole silicon-based solar cell piece into the plurality of cell units;
- step S3: arranging the plurality of cell units and adhering the plurality of cell units to the connecting strip to form the plurality of cell strings;
- step S4: correspondingly welding a positive electrode of the plurality of cell units of the plurality of cell strings and a negative electrode of the plurality of cell units of the plurality of cell strings through the interconnected bar;
- step S5: respectively attaching the hard protection units adapted to the size and specification of the plurality of cell units on the plurality of cell units;
- step S6: connecting the plurality of cell strings to form the cell assembly, wherein the second gap is left between the two adjacent cell strings; and
- step S7: sequentially stacking and laminating a first flexible plate, a first hot melt adhesive layer, the cell assembly, a second hot melt adhesive layer, and a second flexible plate to form the flexible silicon-based cell module.

* * * * *